United States Patent
He

(10) Patent No.: US 12,557,576 B2
(45) Date of Patent: Feb. 17, 2026

(54) METHOD FOR MANUFACTURING RAISED STRIP-SHAPED ACTIVE AREAS

(71) Applicant: Shanghai Huali Integrated Circuit Corporation, Shanghai (CN)

(72) Inventor: Yang He, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 375 days.

(21) Appl. No.: 18/464,861

(22) Filed: Sep. 11, 2023

(65) Prior Publication Data
US 2024/0170292 A1 May 23, 2024

(30) Foreign Application Priority Data

Nov. 22, 2022 (CN) .......................... 202211466495.8

(51) Int. Cl.
*H01L 21/306* (2006.01)
*H01L 21/02* (2006.01)
*H01L 21/033* (2006.01)
*H01L 21/3105* (2006.01)
*H01L 21/311* (2006.01)

(52) U.S. Cl.
CPC .. *H01L 21/30604* (2013.01); *H01L 21/02164* (2013.01); *H01L 21/0332* (2013.01); *H01L 21/31055* (2013.01); *H01L 21/31116* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 2016/0056082 A1* | 2/2016 | Cheng | H10D 84/038 438/8 |
| 2020/0126980 A1* | 4/2020 | Park | H10D 30/024 |

\* cited by examiner

*Primary Examiner* — Stephanie P Duclair

(57) ABSTRACT

A method for manufacturing raised strip-shaped active areas is disclosed, including: step 1: performing etching on a semiconductor substrate to form patterning raised strip-shaped structures and shallow trenches; step 2: forming a second dielectric layer which fills the shallow trenches and extends to a surface of the first hard mask layer on top surfaces of the raised strip-shaped structures; step 3: performing the first CMP on second dielectric layer, the first CMP stops at a surface of a first hard mask layer; step 4: performing planarization adjustment on a top surface of the second dielectric layer through second wet etching to reduce a height difference of the top surface of the second dielectric layer in different areas; step 5: removing the first hard mask layer; and step 6: performing third dry etching to reduce the top surface of the second dielectric layer to below the top surface of each raised strip-shaped structure.

11 Claims, 6 Drawing Sheets

METHOD FOR MANUFACTURING RAISED STRIP-SHAPED ACTIVE AREAS

CROSS-REFERENCES TO RELATED APPLICATIONS

This application claims the priority to Chinese patent application No. 202211466495.8, filed on Nov. 22, 2022, and entitled "METHOD FOR MANUFACTURING RAISED STRIP-SHAPED ACTIVE AREAS", the disclosure of which is incorporated herein by reference in entirety.

TECHNICAL FIELD

The present application relates to a method for manufacturing a semiconductor integrated circuit, in particular to a method for manufacturing raised strip-shaped active areas.

BACKGROUND

Development of semiconductor manufacturing technology constantly shrinks the gate width. Traditional planar CMOS devices can no longer meet the needs of devices, such as controlling short channel effects. It is necessary to use Fin Field-Effect Transistor (FinFET) at smaller process nodes for the better electrical performance of the FinFET structures.

The advanced semiconductor manufacturing process of FinFET involves a new process platform that faces new problems and challenges. Fins in FinFET are raised strip-shaped structures formed by etching a semiconductor substrate. After the formation of the fins, it is necessary to form Shallow Trench Isolation (STI) by filling the bottom areas of shallow trenches between the fins with an oxide layer. The fin active areas are formed at portions of the fins above the top surface of the shallow trench isolation. An existing process for forming raised strip-shaped active areas includes the following steps:

Performing an etching process to form raised strip-shaped structures, namely fins, and covering a top surface of each raised strip-shaped structure is covered with a hard silicon nitride mask layer.

Filling a silicon oxide layer in the shallow trenches between the raised strip-shaped structures and extends to a surface of the silicon nitride hard mask layer outside the shallow trenches.

Performing STI Chemical-mechanical planarization (STI-CMP) to ensure good morphology of the silicon oxide layer on the fins. The thickness of silicon oxide layer in various areas of the wafer post STI-CMP is different, indicating that the position of the top surface of silicon oxide layer during STI-CMP is different. Such thickness difference of silicon oxide layer will always exist in a later silicon oxide recess etching process, ultimately leading to poor fin height uniformity.

Process steps after STI-CMP include:
removing the silicon nitride hard mask layer (SiN removal);
performing a well ion implantation process loop (Well IMP loop) to form N wells in the raised strip-shaped structures of a PMOS forming area and P wells in the raised strip-shaped structures of an NMOS forming area; and
performing etching-back process of silicon oxide layer for STI (STI EB), that is, performing a silicon oxide recess etching process. The etching-back of silicon oxide layer is achieved through a dry etching process. After this etched back, the top surface of the silicon oxide layer will be lower than the top surfaces of each of the raised strip-shaped structures, thus the raised strip-shaped structures above the top surface of silicon oxide layer form raised strip-shaped active areas.

The difference in the heights of the top surface surfaces of the silicon oxide layer at various areas of the wafer occurred post STI-CMP will be transferred to steps of SiN removal, Well IMP loop and STI etch back, ultimately leading to a problem in the height uniformity of the raised strip-shaped active areas.

BRIEF SUMMARY

According to some embodiments in this application, a method for manufacturing raised strip-shaped active areas is disclosed in the following steps:

step 1: providing a semiconductor substrate in a wafer structure: performing a first etching on the semiconductor substrate to pattern a plurality of raised strip-shaped structures, and forming shallow trenches between two of the plurality of raised strip-shaped structures:

defining a forming area of the plurality of raised strip-shaped structures by a first hard mask layer, wherein the first hard mask layer is patterned to be on top surfaces of the plurality of raised strip-shaped structures after the first etching:

step 2: forming a second dielectric layer, wherein the second dielectric layer fills the shallow trenches and extends to a surface of the first hard mask layer on top surfaces of the plurality of raised strip-shaped structures:

step 3: applying a first chemical-mechanical planarization (CMP) on the second dielectric layer, wherein the first CMP stops at the surface of the first hard mask layer, wherein polishing speed of the first CMP in different areas of the semiconductor substrate is different, resulting in a height difference of top surfaces of the second dielectric layer in different areas of the semiconductor substrate, wherein a top surface of the second dielectric layer is higher than the top surface of each of the plurality of raised strip-shaped structures:

step 4: performing a planarization adjustment on the top surface of the second dielectric layer through a second etching to reduce the height difference of the top surface of the second dielectric layer in different areas of the semiconductor substrate, wherein the top surface of the second dielectric layer is kept to be higher than the top surface of each of the plurality of raised strip-shaped structures, wherein the second etching is a wet etch:

step 5: removing the first hard mask layer; and step 6: performing a third etching on the second dielectric layer to reduce the top surface of the second dielectric layer to below the top surface of each of the plurality of raised strip-shaped structures, forming a raised strip-shaped active area from a portion of each of the plurality of raised strip-shaped structures located above the top surface of the second dielectric layer, wherein the second dielectric layer forms a shallow trench isolation area between two of the raised strip-shaped active areas, and wherein the third etching is a dry etch.

In some cases, in step 1, the semiconductor substrate includes a silicon substrate.

In some cases, the material of the first hard mask layer is silicon nitride.

In some cases, in step 2, the material of the second dielectric layer includes silicon dioxide.

In some cases, in step 3, the polishing speed at a wafer edge area of the semiconductor substrate is different from the polishing speed at a wafer center area, and the top surface of the second dielectric layer at the wafer edge area is higher than the top surface of the second dielectric layer in the wafer center area.

In some cases, in step 1, the semiconductor substrate includes a high density distribution area and an low density area, the distribution density of the raised strip-shaped structures in the high density area is higher than the distribution density of the raised strip-shaped structures in the low density area, and the width of each shallow trench in the high density area is smaller than the width of each shallow trench in the low density area.

In some cases, in step 4, etching solution for the second wet etching is diluted hydrofluoric acid (DHF).

In some cases, in step 4, the total etched amount of the second dielectric layer is in a range of 0.5 nm-4 nm.

In some cases, in step 4, the total etched amount of the second dielectric layer at the wafer edge area by the second wet etching process is greater than the total etched amount of the second dielectric layer in the wafer center area.

In some cases, in step 4, the total etched amount of the second dielectric layer at the wafer edge area by the second wet etching process is in the range of 0.5 nm-1.5 nm greater than the total etched amount of the second dielectric layer in the wafer center area.

In some cases, the wafer edge area includes a wafer area with a radius greater than or equal to 94 mm, and the wafer center area includes a wafer area with a radius smaller than or equal to 50 mm.

In some cases, in step 4, the diluted hydrofluoric acid in the second wet etching is prepared by mixing 49% concentrated hydrofluoric acid (HF) solution with pure water according to a ratio in the range of 200:1 to 500:1.

In some cases, after step 5 and before step 6, the method further includes:

performing a well ion implantation process.

In the present application, after completing the first chemical-mechanical planarization of the second dielectric layer filling the shallow trenches between the raised strip-shaped structures such as fins, the first hard mask layer is not directly removed, but second wet etching is additionally performed, through which planarization adjustment is performed on the top surface of the second dielectric layer, thus eliminating the adverse influence of the first chemical-mechanical planarization on the planarization of the top surface of the second dielectric layer due to different polishing speeds in different areas. Then, the first hard mask layer is removed and third dry etching is performed on the second dielectric layer to enable the top surface of the second dielectric layer to be lower than the top surface of each raised strip-shaped structure, thus ultimately forming the raised strip-shaped active areas, and eliminating the influence of the first chemical-mechanical planarization on the height of the raised strip-shaped active areas due to different polishing speeds in different areas. Therefore, the present application can improve the height uniformity of the raised strip-shaped active areas in the wafer surface and thus improve the product yield.

BRIEF DESCRIPTION OF THE DRAWINGS

The present application will be further described below in detail in combination with the specific embodiments with reference to the drawings.

DETAILED DESCRIPTION OF THE APPLICATION

Figure 1:
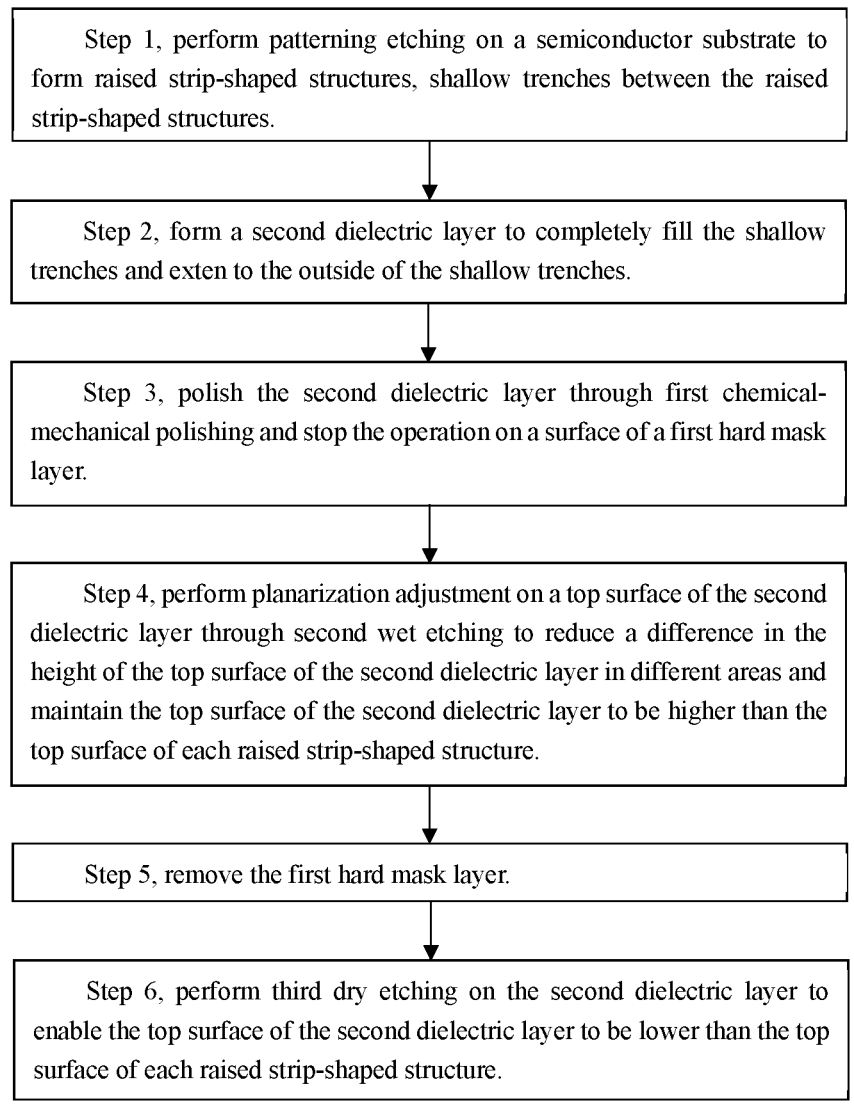
FIG. 1 illustrates a flowchart of a method for manufacturing raised strip-shaped active areas according to an embodiment of the present application.
Figure 2A:
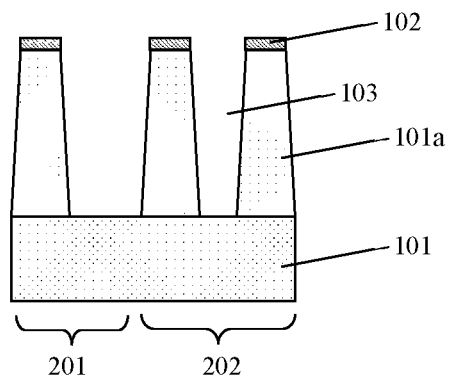
FIGS. 2A-2E illustrate schematic cross-sectional structures of devices obtained in each step of a method for manufacturing raised strip-shaped active areas according to an embodiment of the present application.
Figure 3:
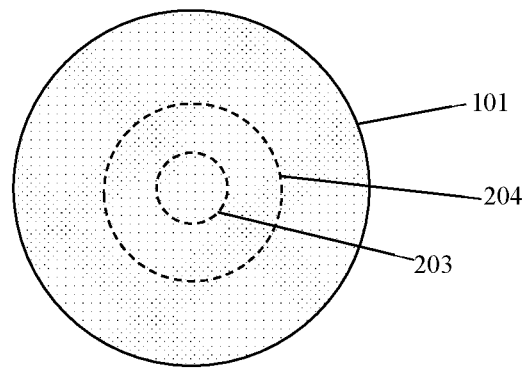
FIG. 3 illustrates a schematic top view of a wafer in a method for manufacturing raised strip-shaped active areas according to an embodiment of the present application.

Referring to FIG. 1, it illustrates a flowchart of a method for manufacturing raised strip-shaped active areas according to an embodiment of the present application. Referring to FIG. 2A-2E, they illustrate schematic cross-sectional structures of devices obtained in each step of a method for manufacturing raised strip-shaped active areas according to an embodiment of the present application. Referring to FIG. 3, it illustrates a schematic top view of a wafer in a method for manufacturing raised strip-shaped active areas according to an embodiment of the present application. The method for manufacturing raised strip-shaped active areas according to the embodiment of the present application includes the following steps:

In step 1, referring to FIG. 2A, a semiconductor substrate 101 is provided. The semiconductor substrate 101 is in a wafer structure. See FIG. 3 for the wafer structure.

Patterning etching is performed on the semiconductor substrate 101 to form a plurality of raised strip-shaped structures 101a. Shallow trenches 103 are formed between the raised strip-shaped structures 101a.

A forming area of each raised strip-shaped structure 101a is defined by a first hard mask layer 102. The first hard mask layer 102 is reserved on a top surface of the raised strip-shaped structure 101a after patterning etching.

In the embodiment of the present application, the semiconductor substrate 101 includes a silicon substrate.

The material of the first hard mask layer 102 is silicon nitride.

The semiconductor substrate 101 includes a high density area 202 and a low density area 20. The distribution density of the raised strip-shaped structures 101a in the high density area 202 is higher than the distribution density of the raised strip-shaped structures 101a in the low density area 201. The width of each shallow trench 103 in the high density area 202 is smaller than the width of each shallow trench 103 in the low density area 201.

Figure 2B:
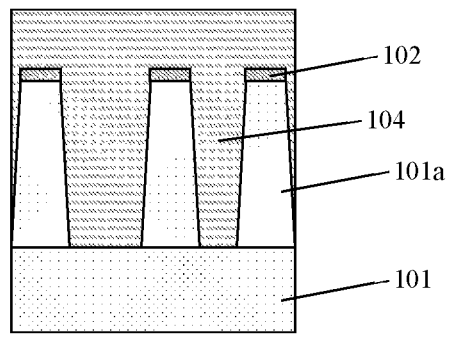

In step 2, referring to FIG. 2B, a second dielectric layer 104 is formed. The second dielectric layer 104 fills the shallow trenches 103 and extends to a surface of the first hard mask layer 102 which are outside the shallow trenches 103.

In the embodiment of the present application, the material of the second dielectric layer 104 includes silicon dioxide.

Figure 2C:
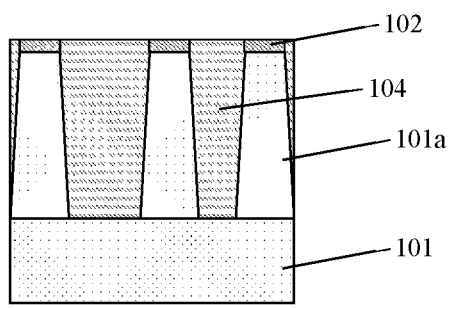

In step 3, referring to FIG. 2C, the second dielectric layer 104 is polished through first chemical-mechanical planarization and the operation is stopped on the surface of the first hard mask layer 102. The polishing speeds of the first chemical-mechanical planarization in different areas of the semiconductor substrate 101 are different, resulting in a difference in the height of the top surface of the second dielectric layer 104 in different areas of the semiconductor substrate 101. The top surface of the second dielectric layer 104 is higher than the top surface of each raised strip-shaped structure 101a.

In the embodiment of the present application, the polishing speed at a wafer edge area of the semiconductor substrate 101 is different from the polishing speed at a wafer center area. The top surface of the second dielectric layer 104 at the wafer edge area is higher than the top surface of the second dielectric layer 104 in the wafer center area. Referring to FIG. 3, the area in dashed circle 203 is located in the wafer center area, and the area with a radius greater than the radius of dashed circle 204 is the wafer edge area. After the first chemical-mechanical planarization, the thickness of the second dielectric layer 104 in dashed circle 203 will be smaller than the thickness of the second dielectric layer 104 located outside dashed circle 204.

Figure 4A:
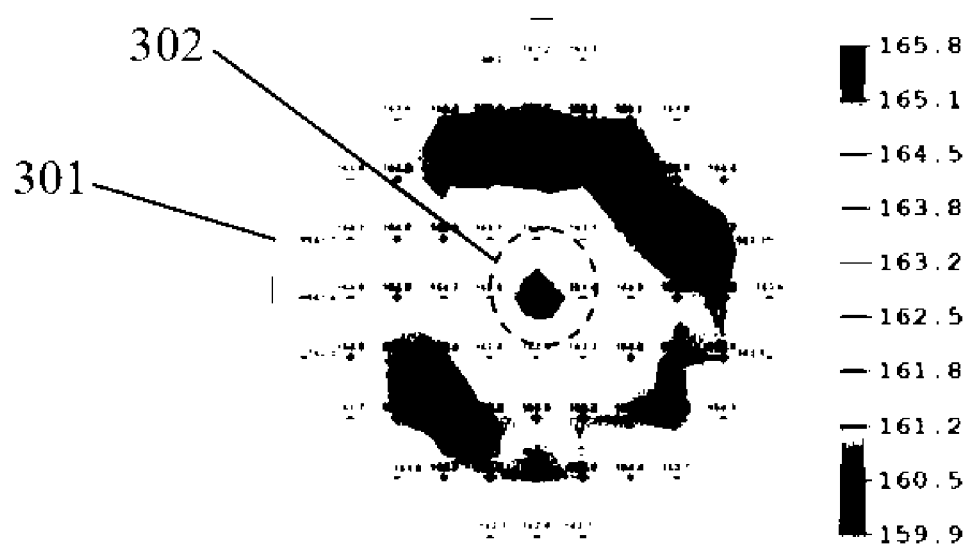
FIG. 4A illustrates a measured height map of the top surface of the second dielectric layer on a wafer after the first chemical-mechanical planarization is completed in a method for manufacturing raised strip-shaped active areas according to an embodiment of the present application.

Referring to FIG. 4A, it illustrates a measured height map of the top surface of the second dielectric layer 104 on a wafer after first chemical-mechanical planarization is completed in a method for manufacturing raised strip-shaped active areas according to an embodiment of the present application. In the wafer measurement map 301, different colors are used for representing the height of the top surface of the second dielectric layer 104, i.e., the thickness of the second dielectric layer 104. Different colors are printed in black and white, and are represented by different grayscales. It can be seen that the thickness of the second dielectric layer 104 in the wafer center area illustrated in dashed circle 302 is the smallest.

In step 4, planarization adjustment is performed on the top surface of the second dielectric layer 104 through second wet etching to reduce a difference in the height of the top surface of the second dielectric layer 104 in different areas of the semiconductor substrate 101 and maintain the top surface of the second dielectric layer 104 to be higher than the top surface of each raised strip-shaped structure 101a.

In the embodiment of the present application, etching solution for the second wet etching is diluted hydrofluoric acid.

The total etched amount of the second dielectric layer 104 is in a range of 0.5 nm-4 nm.

The total etched amount of the second dielectric layer 104 at the wafer edge area by the second wet etching process is greater than the total etched amount of the second dielectric layer 104 in the wafer center area.

The total etched amount of the second dielectric layer 104 at the wafer edge area by the second wet etching process is in the range of 0.5 nm-1.5 nm greater than the total etched amount of the second dielectric layer 104 in the wafer center area.

The wafer edge area includes an area with a radius greater than or equal to 94 mm in the wafer structure, and the wafer center area includes an area with a radius smaller than or equal to 50 mm in the wafer structure.

The diluted hydrofluoric acid used for the second wet etching is prepared by mixing 49% HF concentrated solution with pure water according to a ratio in the range of 200:1 to 500:1.

Figure 2D:
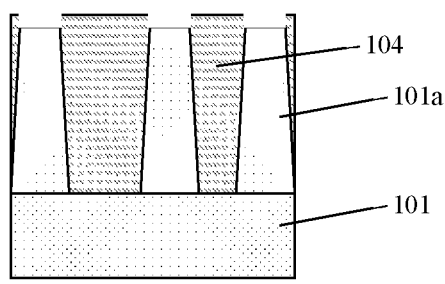

In step 5, referring to FIG. 2D, the first hard mask layer 102 is removed.

In some embodiments, silicon nitride of the first hard mask layer 102 is removed through a wet etching process.

In the embodiment of the present application, after step 5 and before step 6, the method further includes:
performing a well ion implantation process.

The well ion implantation process includes P well ion implantation and N well ion implantation. P well ion implantation is usually performed in an NMOS forming area, while N well ion implantation is usually performed in a PMOS forming area.

Figure 2E:
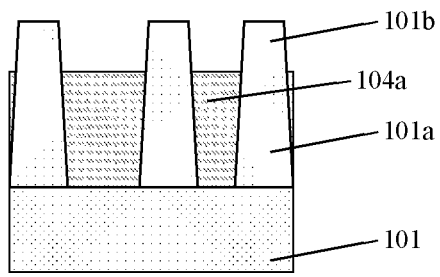

In step 6, referring to FIG. 2E, the third dry etching is performed on the second dielectric layer 104 to make the top surface of the second dielectric layer 104 lower than the top surface of each raised strip-shaped structure 101a. Portions of the raised strip-shaped structures 104 located above the top surface of the second dielectric layer 104 form raised strip-shaped active areas. The second dielectric layer 104 forms shallow trenches 103 between the raised strip-shaped active areas.

In the embodiment of the present application, after completing the first chemical-mechanical planarization of the second dielectric layer 104 filling the shallow trenches 103 between the raised strip-shaped structures 101a such as fins, the first hard mask layer 102 is not directly removed, but second wet etching is performed in addition, through which planarization adjustment is performed on the top surface of the second dielectric layer 104, thus eliminating the adverse influence of the first chemical-mechanical planarization on the planarization of the top surface of the second dielectric layer 104 due to different polishing speeds in different areas. Then, the first hard mask layer 102 is removed and third dry etching is performed on the second dielectric layer 104 to reduce the top surface of the second dielectric layer 104 to be lower than the top surface of each raised strip-shaped structure 101a, thus ultimately forming the raised strip-shaped active areas, and eliminating the influence of the first chemical-mechanical planarization on the height of the raised strip-shaped active areas due to different polishing speeds in different areas. Therefore, the present application can improve the uniformity of the height of the raised strip-shaped active areas in the wafer surface and thus improve the product yield.

Figure 4B:
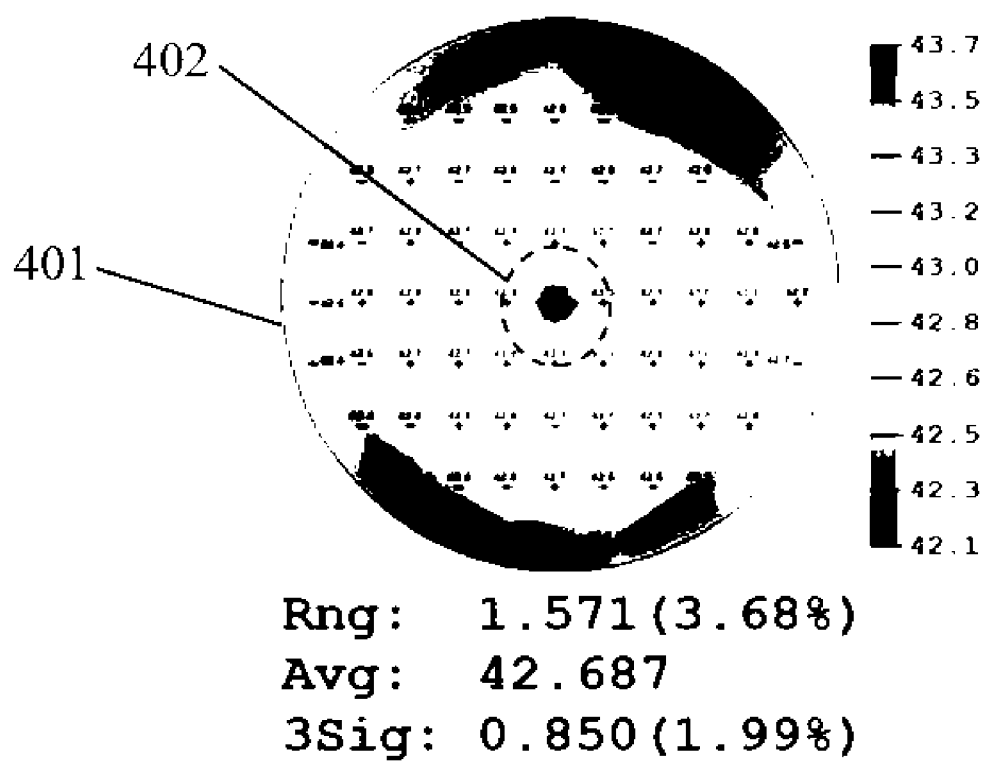
FIG. 4B illustrates a measured height map of the raised strip-shaped active areas on a wafer after they are formed on a wafer in an existing method for manufacturing raised strip-shaped active areas.

In the embodiment of the present application, step 3 is STI CMP, and the process steps before step 3 are the same as the steps in the existing process. The second wet etching in step 4 is adjusted by using DHF, which can be abbreviated as DHF adjust. Subsequent step 5 corresponds to SiN removal, and the well ion implantation process is Well IMP loop. Step 6 corresponds to STI etch back. Therefore, in the embodiments of the present application, the processes following STI CMP are sequentially DHF adjust, SiN removal, Well IMP loop and STI etch back, which are one more process step of DHF adjust than SiN removal, Well IMP loop and STI etch back in the existing method. Adding DHF adjust can increase the uniformity of the heights of the raised strip-shaped active areas. Referring to FIG. 4B, it illustrates a measured height map of the raised strip-shaped active areas after they are formed on a wafer after raised strip-shaped active areas are formed in the existing method for manufacturing raised strip-shaped active areas. It can be seen that the surface of the raised strip-shaped active areas in the wafer center area inside the dashed circle 402 is the highest of the full wafer map 401, which has influenced the uniformity of the heights of the raised strip-shaped active areas.

Figure 4C:
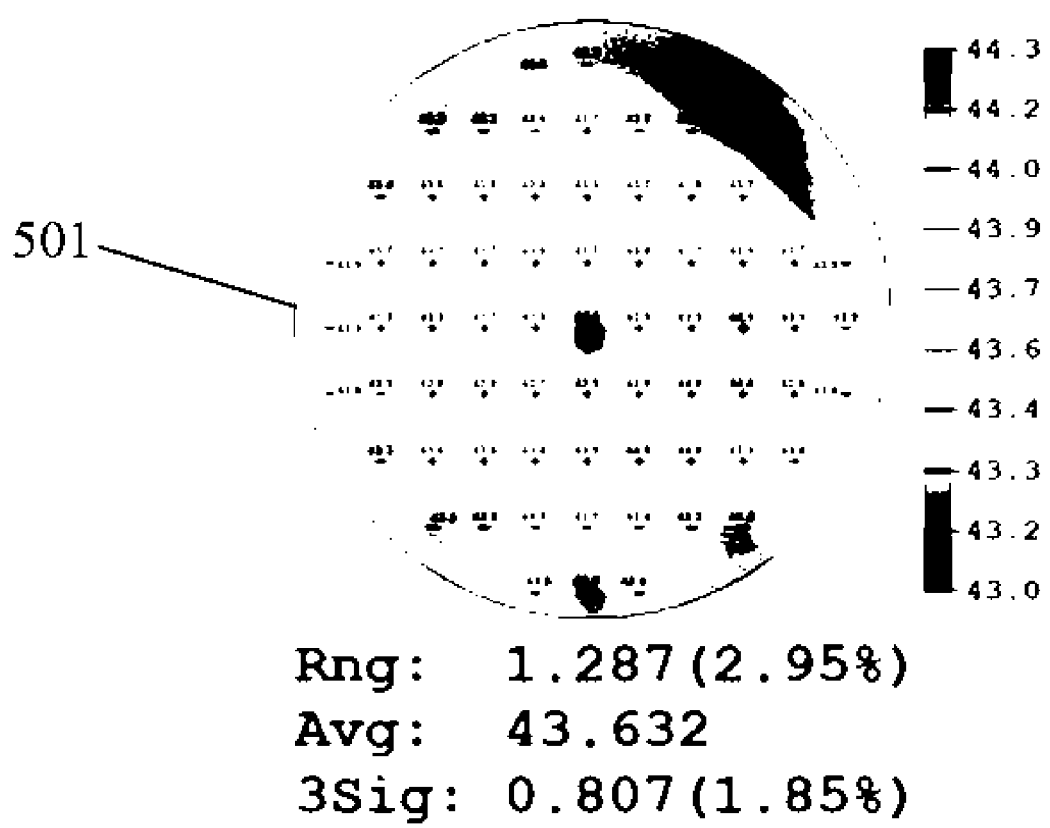
FIG. 4C illustrates a measured height map of the raised strip-shaped active areas on a wafer after they are formed on a wafer according to the method for manufacturing raised strip-shaped active areas in this present application.

Referring to FIG. 4C, it illustrates measured height map of the raised strip-shaped active areas on a wafer after they are formed on a wafer according to the method for manufacturing raised strip-shaped active areas in this present application. It can be seen that the difference between the heights of the raised strip-shaped active areas in all areas in the wafer measurement map 501 is small.

In the embodiment of the present application, the height of silicon oxide inside and outside the wafer is adjusted by adding DHF before the deep well ion implantation process, thus ensuring good uniformity in the silicon oxide wafer before the key process fin etch back, i.e., STI etch back, and improving the uniformity of the fin heights, i.e., the raised strip-shaped active areas in the wafer.

Surface of the silicon oxide layer is higher than fins before the fin recess process, and controlling the DHF etched amount can achieve the effect of not affecting the silicon oxide/fin structure. At the same time, the uniformity in the silicon oxide layer can be improved by adjusting the DHF recipe.

Through experimental measurements, it can be seen that after improvement from the method of the present application, the full height map range reflecting the uniformity of the fin heights after fin recess, i.e., STI recess, has decreased from about 1.6 nm to about 1.3 nm, and the critical dimension uniformity (CDU) full range has increased by 18.7%.

The present application has been described above in detail through the specific embodiments, which, however, do not constitute limitations to the present application. Without departing from the principle of the present application, those skilled in the art may make many modifications and improvements, which, however, should also be considered as included in the scope of protection of the present application.

What is claimed is:

1. A method for manufacturing raised strip-shaped active areas, comprising:
   step 1: providing a semiconductor substrate in a wafer structure; performing a first etching on the semiconductor substrate to pattern a plurality of raised strip-shaped structures, and forming shallow trenches between two of the plurality of raised strip-shaped structures;
   defining a forming area of the plurality of raised strip-shaped structures by a first hard mask layer, wherein the first hard mask layer is patterned to be on top surfaces of the plurality of raised strip-shaped structures after the first etching;
   step 2: forming a second dielectric layer, wherein the second dielectric layer fills the shallow trenches and extends to a surface of the first hard mask layer on the top surfaces of the plurality of raised strip-shaped structures, wherein a material of the second dielectric layer comprises silicon dioxide;
   step 3: applying a first chemical-mechanical planarization (CMP) on the second dielectric layer, wherein the first CMP stops at the surface of the first hard mask layer, wherein a polishing speed of the first CMP in different areas of the semiconductor substrate is different, resulting in a height difference of top surfaces of the second dielectric layer in the different areas of the semiconductor substrate, wherein a top surface of the second dielectric layer is higher than the top surface of each of the plurality of raised strip-shaped structures, wherein a polishing speed at a wafer edge area of the semiconductor substrate is different from a polishing speed in a wafer center area, and a top surface of the second dielectric layer at the wafer edge area is higher than a top surface of the second dielectric layer in the wafer center area;
   step 4: performing a planarization adjustment on the top surface of the second dielectric layer through a second etching to reduce the height difference of the top surface of the second dielectric layer in the different areas of the semiconductor substrate, wherein the top surface of the second dielectric layer is kept to be higher than the top surface of each of the plurality of raised strip-shaped structures, wherein the second etching is a wet etch;
   step 5: removing the first hard mask layer; and
   step 6: performing a third etching on the second dielectric layer to reduce the top surface of the second dielectric layer to below the top surface of each of the plurality of raised strip-shaped structures, forming a raised strip-shaped active area from a portion of each of the plurality of raised strip-shaped structures located above the top surface of the second dielectric layer, wherein the second dielectric layer forms a shallow trench isolation area between two of the raised strip-shaped active areas, and wherein the third etching is a dry etch.

2. The method for manufacturing the raised strip-shaped active areas according to claim 1, wherein, in step 1, the semiconductor substrate comprises a silicon substrate.

3. The method for manufacturing the raised strip-shaped active areas according to claim 1, wherein a material of the first hard mask layer comprises silicon nitride.

4. The method for manufacturing the raised strip-shaped active areas according to claim 1, wherein, in step 1, the semiconductor substrate comprises a high density area and a low density area, wherein a density of the raised strip-shaped structures in the high density area is higher than a density of the raised strip-shaped structures in the low density area, and wherein a width of each shallow trench in the high density area is smaller than a width of each shallow trench in the low density area.

5. The method for manufacturing the raised strip-shaped active areas according to claim 4, wherein, in step 4, an etching solution for the second etching is diluted hydrofluoric acid.

6. The method for manufacturing the raised strip-shaped active areas according to claim 5, wherein, in step 4, a total etched amount of the second dielectric layer is in a range of 0.5 nm-4 nm.

7. The method for manufacturing the raised strip-shaped active areas according to claim 6, wherein, in step 4, the total etched amount of the second dielectric layer at the wafer edge area by the second etching is greater than the total etched amount of the second dielectric layer in the wafer center area.

8. The method for manufacturing the raised strip-shaped active areas according to claim 7, wherein, in step 4, the total etched amount of the second dielectric layer at the wafer edge area by the second etching is in the range of 0.5 nm-1.5 nm greater than the total etched amount of the second dielectric layer in the wafer center area.

9. The method for manufacturing the raised strip-shaped active areas according to claim 8, wherein the wafer edge area comprises an area with a radius greater than or equal to 94 mm in the wafer structure, and the wafer center area comprises an area with a radius smaller than or equal to 50 mm in the wafer structure.

10. The method for manufacturing the raised strip-shaped active areas according to claim 5, wherein, in step 4, the diluted hydrofluoric acid used for the second etching is prepared by mixing 49% concentrated HF solution with pure water according to a ratio in a range of 200:1 to 500:1.

11. The method for manufacturing the raised strip-shaped active areas according to claim 1, wherein, after step 5 and before step 6, the method further comprises:
performing a well ion implantation process.

* * * * *